(12) United States Patent
Marks

(10) Patent No.: US 9,041,434 B2
(45) Date of Patent: May 26, 2015

(54) CONTROL DEVICE AND METHOD FOR ACTUATING A SEMICONDUCTOR SWITCH

(76) Inventor: Walter Marks, Kunzelsau (DE)

( * ) Notice: Subject to any disclaimer, the term of this patent is extended or adjusted under 35 U.S.C. 154(b) by 0 days.

(21) Appl. No.: 14/116,031

(22) PCT Filed: May 4, 2012

(86) PCT No.: PCT/EP2012/001932
§ 371 (c)(1),
(2), (4) Date: Feb. 4, 2014

(87) PCT Pub. No.: WO2012/152419
PCT Pub. Date: Nov. 15, 2012

(65) Prior Publication Data
US 2014/0320196 A1    Oct. 30, 2014

(30) Foreign Application Priority Data
May 7, 2011  (DE) .......................... 10 2011 100 760

(51) Int. Cl.
| | |
|---|---|
| H03K 3/00 | (2006.01) |
| H03K 17/16 | (2006.01) |
| H02M 1/44 | (2007.01) |
| H03K 17/082 | (2006.01) |
| H03K 17/28 | (2006.01) |
| H03K 17/284 | (2006.01) |

(52) U.S. Cl.
CPC ................. *H03K 17/16* (2013.01); *H02M 1/44* (2013.01); *H03K 17/166* (2013.01); *H03K 17/082* (2013.01); *H03K 17/28* (2013.01); *H03K 17/0822* (2013.01); *H03K 17/284* (2013.01)

(58) Field of Classification Search
USPC .......................................................... 327/109
See application file for complete search history.

(56) References Cited

U.S. PATENT DOCUMENTS

2011/0026278 A1 *  2/2011  Yin ............................ 363/21.15

* cited by examiner

*Primary Examiner* — Daniel Puentes
(74) *Attorney, Agent, or Firm* — Hoffmann & Baron, LLP

(57) ABSTRACT

A control device for influencing a flow of energy in a load circuit between an electrical voltage source and an electrical load, having a semiconductor switch including a conductive section which is formed between an input connection and an output connection, can be looped into the load circuit, and has an electrical resistance adjustable by means of an electrical potential which can be applied to a control connection associated with the semiconductor switch, and having a control circuit which is coupled to the control connection and includes a freewheeling means connected in parallel to the load. The control circuit is designed to supply a control current at the control connection which is proportional to a voltage via the freewheeling means.

14 Claims, 2 Drawing Sheets

CONTROL DEVICE AND METHOD FOR ACTUATING A SEMICONDUCTOR SWITCH

This application claims priority based on an International Application filed under the Patent Cooperation Treaty, PCT/EP2012/001932, filed May 4, 2012, which claims priority to DE102011100760.5, filed May 7, 2011.

BACKGROUND OF THE INVENTION

The invention relates to a control device for influencing a flow of energy in a load circuit between an electrical voltage source and an electrical load, having a semiconductor switch comprising a conductive section which is formed between an input connection and an output connection, which can be looped into the load circuit, and has an electrical resistance adjustable by means of an electrical potential which can be applied to a control connection associated with the semiconductor switch, and having a control circuit which is coupled to the control connection and comprises a freewheeling means, in particular a freewheeling diode, connected in parallel to the load. The invention also relates to a method for actuating a semiconductor switch.

In a switchable electrical load circuit there is usually a direct or magnetically coupled series connection of a voltage source, a semiconductor switch and a load. In order to avoid overloading of the semiconductor switch, a freewheeling diode is connected in parallel to the inductance-prone load, the inductance of which may be determined wholly or partly by the electrical wiring of the load circuit.

A semiconductor switch, for example in the form of a MOSFET or IGBT, is controlled with the aid of a gate-source voltage, ensuing from charging and discharge currents applied to the gate and generating a control charge as a result of the linked internal capacitances of the semiconductor switch. In the case of low-impedance semiconductor switches, the supply potential is substantially applied at the connection point between the semiconductor switch and the directly or magnetically coupled load with the freewheeling diode. If the gate-source voltage is now reduced, in order to bring the semiconductor switch into a blocking state, the internal resistance of the transistor rises and the power converted into heat inside it becomes greater. This is associated with the fact that the current reduces only very slightly due to the effect of the inductance in the load circuit. It is therefore necessary that the freewheeling diode can take over the current flow as soon as possible, before the amount of heat developed in the transistor results in the destruction of the latter.

From EP 0 756 782 B1 it is known, depending on the voltage at the freewheeling semiconductor element, that controllable breaking current sources for continuous reduction of the level of the breaking current may be provided up to a minimum value. Here the minimum value is reached substantially with a voltage value of 0 volts of the reducing voltage at the freewheeling semiconductor element.

DE 40 13 997 discloses, depending on a threshold value of the voltage at the freewheeling semiconductor element, a controllable switch-on current source which is provided for immediate changeover of the amount of switch-on current to a high value, when the threshold value indicates that the freewheeling semiconductor element has switched-off.

The problem of the present invention therefore lies in the further development of the control device and the method for actuating a semiconductor switch so as to ensure, when current is switched on or off, that there is reduced power loss combined with simultaneous more rapid switching of the semiconductor switch.

SUMMARY OF THE INVENTION

This problem is solved according to a first aspect by the features of claim 1. Here it is provided that the control circuit is designed to supply a control current at the control connection which is proportional to a voltage via the freewheeling means.

Provided by this means at the control connection of the semiconductor switch, in particular at a gate control electrode of a transistor, is a high current intensity with a rate of change which follows the rate of voltage change at the freewheeling means, at least substantially directly proportional in time and amount. In this way it is possible to obtain, as compared with what is known from the prior art, a faster switching process in current sources controllable by voltage for actuating the semiconductor switch. This is due to the fact that, in the case of current sources controllable by voltage, there are always unavoidable input capacitances, for example due to the high input resistance and the necessary electrical connections of the components of the current sources. Thus, a timer for the current source to be controlled is also always operative, so that the controlled current increasingly lags the controlled voltage, with an increasing rate of voltage change over time and in amount. Here it may occur that the shift of the phasing between voltage and current of the voltage-controlled current source reaches a value of 1 or more than 1 for fractions of the changing freewheeling voltage after conversion into a control current for the gate electrode and from this a fraction of the control voltage occurring between gate and source together with the voltage gain in the semiconductor switch, so that there is an unacceptable ring gain resulting in a self-excited interference transmitter which emits incompatible interference power into the environment. According to the invention, the freewheeling voltage changing through the freewheeling means is provided as control current with minimal delay, preferably with no delay, at the control connection of the semiconductor switch, so that the phase shifting known from the prior art is at least almost completely avoided, and self-excitation of the control device is therefore prevented. By this means, in, switching on and off of the semiconductor switch, in each case more rapid switching is also achieved than with the prior art and, despite an increased rate of voltage change at the control connection of the semiconductor switch and thus over the conductive section of the semiconductor switch, undesired and/or unacceptable interference voltages and interference pulses are avoided to the maximum extent.

Advantageous developments of the invention are set out in the dependent claims.

It is expedient for the control circuit to have a voltage-current transformer and a coupling device connected electrically to the voltage-current transformer, wherein the coupling device is configured so as to provide an electrical current flowing through the voltage-current transformer in a proportional manner as control current at the control connection of the semiconductor switch. The task of the voltage-current transformer is to convert the voltage via the freewheeling means with minimal delay, preferably with no delay, into a default current. This default current is supplied to a coupling device which in turn provides a control current to the control connection of the semiconductor switch as a proportional function of the default current.

Preferably the coupling device is in the form of a current mirror or an electrical level shifter, in particular a transistor.

In a development of the invention it is provided that the voltage-current converter includes at least one active resistance, in particular solely in the form of an ohmic resistance. This makes it possible to achieve a conversion of the electrical voltage into the default current via the freewheeling means with minimal delay, in particular with no delay.

It is advantageous when the voltage-current converter is in the form of a series connection of several, in particular equivalent, ohmic resistances, arranged in a wave form to reduce inductive effects. By this means, inductive effects in the ohmic resistances are mutually at least partly equalised and therefore reduced in total. For this purpose, the ohmic resistances are arranged, in respect of their physical alignment and/or direction of flow, at least substantially parallel and where applicable directly adjacent to one another. It is especially preferred for the ohmic resistances to be electrically equivalent, i.e. each having the same ohmic resistance. Also especially preferred is for the ohmic resistances to be similar, in particular identical, in terms of their physical structure and dimensions.

In a further variant of the invention it is provided that the control circuit includes a first coupling connection and a second coupling connection, each connected to the control connection of the semiconductor switch and switchable by means of a changeover device alternately in series with the voltage-current converter. By means of the first coupling connection for example a switch-on current may be provided at the control connection of the semiconductor switch, while through the second coupling connection a switch-off current is made available at the control connection of the semiconductor switch. Alternately, with the aid of the changeover device, in particular depending on an external control signal, either a switch-on operation or a switch-off operation for the semiconductor switch is effected.

In an alternative variant, the control circuit includes a first control current path with a series connection of a first voltage-current converter and a first coupling device, and a second control current path with a series connection of a second voltage-current converter and a second coupling device together with a changeover device, which is designed in a first functional position to provide a control current via the first control current path, and in a second functional position to provide a control current via the second control current path, to the control connection of the semiconductor switch.

Preferably the changeover device is so designed that it may be switched into a third functional position, in particular a neutral position, in which no control current is provided by a voltage-current converter to the control connection of the semiconductor switch. By this means, following completion of the switch-on or switch-off operation, a clear presettable switching state for the semiconductor switch is predetermined.

In a development of the invention, the changeover device is assigned an actuating device which, with the aid of a presettable time duration or with the aid of a detection of a minimum or maximum electrical voltage between the input connection and the output connection, is designed to switch the changeover device into the third functional position. Consequently the clear switching state of the semiconductor switch after the switch-on or switch-off operation is assumed either after the expiry of a presettable time span which commences with the arrival of the external control signal, or after corresponding detection of a presettable maximum or minimum electrical voltage between the input connection and the output connection of the semiconductor switch.

According to a second aspect of the invention, a method with the features of claim 11 is provided. In this method for actuating a semiconductor switch in a direct current load circuit, a conductive section of the semiconductor switch with changeable resistance is looped in between an electrical voltage source and an electrical load, and includes freewheeling means connected in parallel to the electrical load, wherein with a change of voltage via the freewheeling means, a change of current flow in a voltage-current converter, which is connected in parallel to the voltage via the freewheeling means, is provided as a proportional control current change at a control connection of the semiconductor switch.

In a variant of the method, an external control signal for a switch-on and/or switch-off of the semiconductor switch is provided at the changeover device, wherein a changeover of the changeover device from the first or second functional position into the third functional position is made following the expiry of a presettable duration of time after arrival of the control signal, or on detection of a presettable minimum or maximum voltage between the input connection and the output connection and/or between the input connection and the control connection of the semiconductor switch.

BRIEF DESCRIPTION OF THE DRAWINGS

Advantageous embodiments of the invention are shown in the drawing, namely in.

DETAILED DESCRIPTION OF THE PREFERRED EMBODIMENTS

Figure 1:
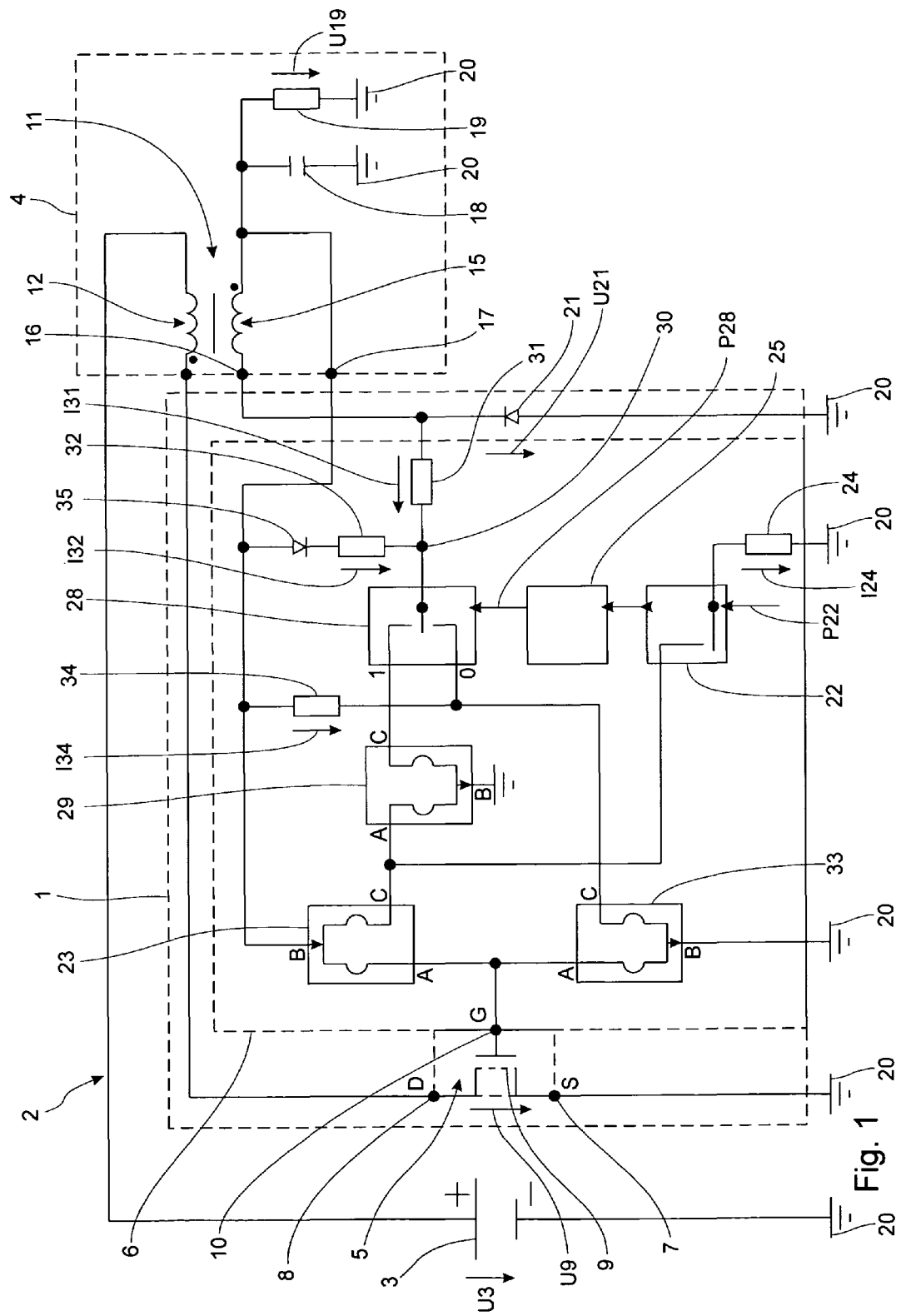
FIG. 1: a view of a circuit configuration for a control device according to a first embodiment, and FIG. 2 a view of a circuit configuration for a control device according to a second embodiment.

In the case of the embodiment shown in FIG. 1, provision is made to influence an electrical flow of energy in a load circuit 2 through a control device 1. The load circuit 2 includes, in addition to the control device 1, a voltage source 3 by way of example in the form of a direct current source, with the supply voltage U3 and a load 4.

The control device 1 includes as important elements a semiconductor switch 5 and a control circuit 6 for actuating the semiconductor switch 5. The semiconductor switch 5 is looped into the load circuit 2 with an input connection 7, also described as the source (S) and an output connection 8, described as the drain (D). To influence an electrical resistance of a conductive section 9 formed between the input connection 7 and the output connection 8 in the semiconductor switch 5, a control connection 10 also described as the gate (G) is provided. The control connection 10 is connected to the load 4 via the control circuit 6 in a manner described in detail below.

By way of example, the load 4 includes a transformer 11 with a primary winding 12 and a secondary winding 15. The primary winding 12 is looped into the load circuit 2 in such a way that a current flowing through the conductive section 9 also flows through the primary winding 12. The secondary winding 15 is connected at, a first end section to a first coupling connection 16 and at a second end section to a second coupling connection 17 of the control circuit 6. In addition, the second end section of the secondary winding 15 is assigned a capacitor 18 and a resistance 19, each wired to a frame terminal 20.

In electrical terms, the voltage source 3, the conductive section 9 and the primary winding 12 form a primary magnetization circuit. The secondary winding 15 forms, together with the capacitor 18 and the resistance 19, plus freewheeling means by way of example in the form of a freewheeling diode 21 and connected in parallel to the load 4, a secondary demagnetization circuit.

The energy absorbed in the transformer 11 during the switch-on period of the semiconductor switch 5 is only released to the capacitor 18 and the resistance 19 in the load 4 in the blocking phase of the semiconductor switch 5, in which the conductive section 9 has a high electrical resistance.

By way of example, the capacity of the capacitor 18 is made sufficiently high that the load voltage U19 reduces only very slightly via the resistance 19 during the switch-on period of the semiconductor switch 5, and correspondingly increases only very slightly during the switch-off time of the semiconductor switch 5.

A regulator, not shown in detail, is provided to emit signals with a presettable pulse width, in order to ensure a substantially constant load voltage U19 at the load 4.

In the case of a low-resistance-connected, low-impedance conductive section 9, the start of winding of the primary winding 12, identified by a dot and connected to the output connection 8 of the semiconductor switch 5, is connected to the frame potential at the frame terminal 20. At the end of winding of the primary winding 12 at this point in time, the positive supply potential is applied and brings about a rising primary magnetization current in the primary winding 12 during a switch-on phase. By this means, in the transformer 11, the voltage +U3 is transformed in accordance with the ratio of the number of turns of the primary winding 12 to those of the secondary winding 15 and is so polarised that the blocking voltage U21 at the freewheeling diode 21 is greater by the transformed voltage than the substantially constant voltage +U19 at the resistance 19.

In the case of the high-impedance-wired conductive section 9 of the semiconductor switch 5, the end of the secondary winding 15 connected to the first coupling connection 16 is negatively polarised and connected to the frame potential via the freewheeling diode 21. At the start of winding of the secondary winding 15, which is connected to the coupling connection 17, the positive potential +U19 is applied and creates, during a switch-off phase, a reducing secondary demagnetization current. Here, in the transformer 11, the total of the voltages +U19 and +U21 is transformed in accordance with the ratio of the number of turns of the secondary winding 15 to the primary winding 12 and at the same time so polarised that the voltage U9 over the conductive section 9 between the input connection 7 and the output connection 8 of the semiconductor switch 5, which is also described as the drain-source voltage, is greater by the transformed voltage than the substantially constant voltage +U3.

In order to obtain a change of the conductive section 9 between a low-impedance and a high-impedance state, firstly a switch-off signal P22(0) is provided by the regulator, not shown, at a switch 22. The switch 22 breaks an electrical connection between a current mirror 23 and an ohmic resistance 24, which is connected to a frame terminal 20. On arrival of signal P22(0) a timer 25 emits for a presettable time span Δt a switch-off signal P28(0) at a changeover device in the form of a changeover switch 28. This changeover switch 28 may be switched for example, depending on a signal sequence and/or a signal level of the signal P28, between three switching positions. On arrival of the switch-off signal P28(0), the changeover switch 28 is brought into a switch-off position designated by 0. In the switch-off position of the changeover switch 28 there is no connection between a current mirror 29 and a connection point 30, which is connected to the ohmic resistances 31 and 32. Since not only the connection of the current mirror 23 to the ohmic resistance 24 but also to the connection point 30 is broken, the current path 23B-23C in the current mirror 23 has zero current. Correspondingly, the current path 23A-236 of the current mirror 23 to the control connection 10 of the semiconductor switch 5 also has zero current.

Instead, the changeover switch 28 connects the ohmic resistances 31 and 32 to the current mirror 33. In this, amounts of currents I31 and I32, which flow through the ohmic resistances 31 and 32, are added to the amount of a current I34 through the ohmic resistance 34, and the resulting total current is reflected in current mirror 33. The current impressed in current path 33A-33B by this means reduces the electrical potential applied at the control connection 10 (gate G) and thus increases the resistance of the conductive section 9.

In the switch-off operation for the semiconductor switch 5 described above, the change in conductivity of the conductive section 9 and thus of the voltage U-drain-source between the input connection 7 and the output connection 8 of the semiconductor switch 5 is effected by charging of the Miller capacitance inherently present in the semiconductor switch 5 with the entire voltage step comprising the total of the supply voltage U3 and the voltages U19+U21 transformed in the transformer 11. Charging of the Miller capacitance into the semiconductor switch 5 is effected by the current impressed in the current path 33A-33B.

With the reduction of the voltage U21 at the freewheeling diode 21, the current I31 through the resistance 31 decreases proportionately. In the further course of the switch-off operation, the polarity of the freewheeling diode 21 is reversed, leading to a negative current −I31. Preferably the ohmic resistance 32 is so dimensioned that, in this situation, the amount of the current I32 mainly compensates for the amount of the negative current −I31, so that only the current I34 in the ohmic resistance 34 is provided at the current mirror 33, and is reflected by it. The reflected current reduces the control charge (U-gate-source; at the control connection 10 of the semiconductor switch 5.

To switch the semiconductor switch 5 back on again, the signal P22(1) is provided at the changeover switch 22. This creates an electrical connection between the ohmic resistance 24 and the current mirror 23, by which means a load voltage U19 leads to a current flow in the current path B23-C23 in the current mirror 23. An amount of this current comes to I24=U19/R24, in which R24 is the ohmic resistance of the resistance 24.

In addition, a switch-on signal P28(1) is emitted at the changeover switch 28, causing the latter to move into the switch position designated 1 and to create an electrically conductive connection between the connection point 30 and the current mirror 29. By this means, a total current from the currents I31 and I32, which before the polarity reversal of the freewheeling voltage in the blocking direction substantially amounted to zero, and the current I24, is provided with the aid of the current mirror 23 as charging current at the control connection 10 of the semiconductor switch 5. In this way, the voltage between the control connection 10 and the input connection 7 (U-gate-source) is increased and a reduction in the ohmic resistance of the conductive section 9 is brought about. Because of this, there is an increasing magnetization current in the primary winding 12 of the transformer 11, leading to a decreasing demagnetization current in the secondary winding 15. By this means, the freewheeling current I21 through the freewheeling diode 21 is reduced with the result that, within the changeover time for switch-off of the freewheeling current, the freewheeling voltage U21 reverses polarity and becomes positive. The substantially constant current I32 is at the same time, on account of the reduction of the initially negative freewheeling voltage U21 at the freewheeling diode 21, directed at an amount above its negative flow voltage with an increasing portion in the current path 29C-29B of the current mirror 29 and with a proportionally decreasing portion through the ohmic resistance 31. The total current made up of I31 and I32 rises in proportion to the increasingly positive freewheeling voltage U21 and, through the current mirroring in current mirrors 29 and 23, increases the control charge at the control connection 10 (U-gate-source) of the semiconductor switch 5.

The time period Δt which may be preset by the timer 25 corresponds substantially to the switching time of the semiconductor switch 5. Accordingly, after the time period Δt has elapsed, the changeover switch 28 is switched into the third state, so that the total current of I31 and I32 to the current mirror 29 is interrupted. With this, the control current at the control connection 10 is now determined only by the current I24 via the ohmic resistance 24, which is reflected by the current mirror 23. A current flow from the higher positive voltage U21 of the freewheeling diode 21 via the ohmic resistances 31 and 32 to the load voltage U19 is prevented by a diode 35, in this respect polarised in the blocking direction, connected upstream of the ohmic resistance 32.

In the case of the depicted control circuit 6 it is ensured that the voltage between the input connection 7 and the output connection 8 of the semiconductor switch 5 changes with constant harmonics and free from electromagnetic oscillation. This is associated with the fact that the control charge at the control connection 10 is determined by a constant harmonic proportionally changing current which is free from electromagnetic oscillation. At the same time the pattern over time of the charge reversal of the internal Miller capacitance in the semiconductor switch between the control connection 10 (gate) and the output connection 8 (drain) of the semiconductor switch 5 and thus the change over time of the voltage between the output connection 8 (drain) and the input connection 7 (source) is selected so that, during a switch-on or switch-off operation of the semiconductor switch 5, the voltage between the control connection 10 (gate) and the input connection 7 (source) of the semiconductor switch 5 remains substantially constant. It is moreover ensured, through the chosen design of the control circuit 6, that the changing voltage between the output connection 8 (drain) and the input connection 7 (source) is transmitted to the freewheeling diode 21 in the ratio of the number of turns between the primary winding 12 and the secondary winding 15 of the transformer 11, where the voltage U21 changes with constant harmonics and free from electromagnetic oscillation up to the flow voltage −U21.

In addition, the thus changing voltage is effective via the pure ohmic resistance 31, so that the proportionally following current I31 ensues with no time delay and is reflected in via the current mirror 33, without phase rotation, at the control connection 10 of the semiconductor switch 5.

By this means, a 180 degree current feedback between the output connection 8 (drain) and the control connection 10 (gate) of the semiconductor switch is converted with accurate phasing from very high rates of voltage change for the voltage between input and output connections 7, 8 and for the voltage U21 at the freewheeling diode of ohmic resistance 31. In this way it is ensured, during the switch-on operation for the semiconductor switch 5, that the voltage between the input connection 7 and the output connection 8 falls free from electromagnetic oscillation, since the voltage between the control connection 10 and the input connection 7 is increased by a current rising in proportion to the falling voltage, which so determines the time pattern of the discharge of the internal Miller capacitance of the semiconductor switch 5 and with it the decline of the voltage between the input connection 7 and the output connection 8 that, during the decline of the voltage between the input connection 7 and the output connection 8, the voltage between the control connection 10 and the input connection 7 remains substantially constant.

By this means the voltage, thus changing, between the input connection 7 and the output connection 8, is transmitted to the freewheeling diode 21 in the ratio of the number of turns between the primary winding 12 and the secondary winding 15 of the transformer 11. At the freewheeling diode, the voltage U21 is changed in the positive direction above the flow voltage −U21 and the thus changing voltage U21 is fed by the ohmic resistance 31 in a current I31 proportional in amount and time, via the changeover switch 28 and the current mirrors 29 and 23 to the control connection 10, through 180 degrees in phase opposition to the causative voltage between the input connection 7 and the output connection 8, and the phase opposition of the magnetic oscillation is suppressed.

Figure 2:
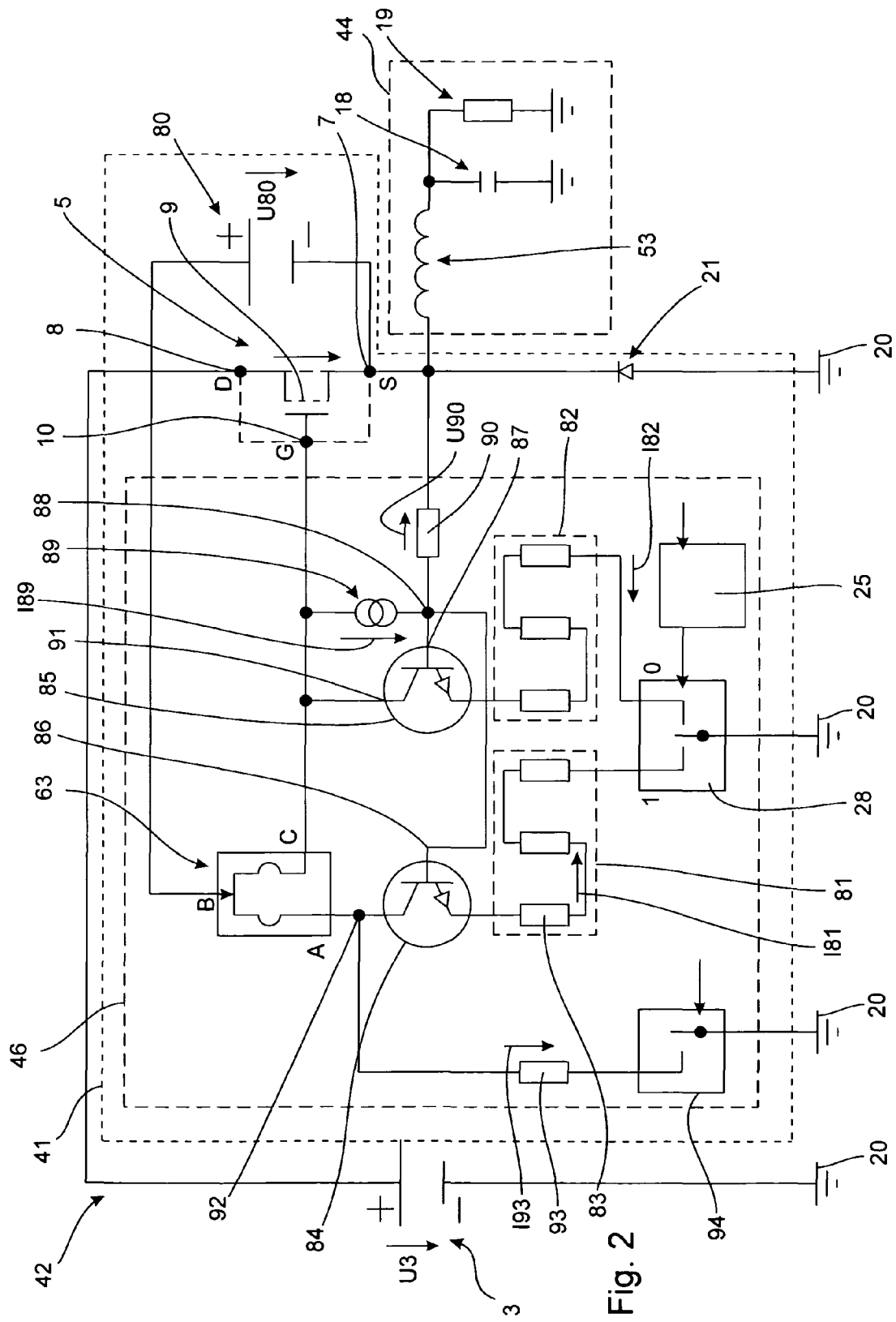

The second embodiment of a control device 41 shown in FIG. 2 has substantially the same functionality as the control device 1, so that components with at least substantially the same function are provided with the same reference number.

By way of example, the load 44 has no transformer, as shown in the first embodiment according to FIG. 1, but instead includes a parallel connection of a capacitor 18 and a resistance 19, which are connected in series with an inductance 53. Both loads 4, 44 should in each case represent any desired combinations of electrical and/or electronic components with ohmic, inductive and capacitive elements.

Also connected in parallel to the load 44 in the second embodiment of the control device 41 are the freewheeling means in the form of the freewheeling diode 21. Alternatively, in both embodiments of the control circuit 6, 46, the freewheeling means may be in the form of a MOSFET, an IGBT or a SICFET.

Also provided for the control device 41, in addition to the voltage source 3, is an auxiliary voltage 80 with a supply potential U80 supplying power to the current mirror 63. If by way of example the semiconductor switch 5 is an NI-channel MOSFET, wired as source follower, then the voltage at the control connection 10 for switch-on, i.e. to reduce the ohmic resistance of the conductive section 9, must be more positive than the supply voltage at the output connection 8. This is achieved by means of the auxiliary voltage source, which provides an electrical potential to the current mirror resulting from addition of the supply potential U3 and the supply potential U80.

Connected to a first output connection of the changeover switch 28 with the designated number 1 is a first ohmic resistance arrangement 81 which, by way of example, is formed of several ohmic resistances 83 connected in series and preferably equivalent in electrical terms. Connected to a second output connection of the changeover switch 28, designated by the number 0, is a second ohmic resistance arrangement 82, similarly formed by ohmic resistances 83 connected in series and preferably equivalent in electrical terms. In both ohmic resistance arrangements, the ohmic resistances 83 are arranged in wave form, in particular directly adjacent to one another and with current flow in each case in the opposite direction, so that inductance effects may be minimised.

Each of the ohmic resistance arrangements 81, 82 is in each case connected to a level shifter, for example in the form of an non-transistor 84, 85. The npn-transistor 84 connected to the first ohmic resistance arrangement 81 is connected by its base, designated as control connection 86, to a connection point 88, to which are also connected the control connection 87 and the base of the second non-transistor 85, together with a breaking current source 89 and a resistance 90.

The resistance 90 is connected to the input connection 7 of the semiconductor switch 5. The breaking current source 89 is connected to the control connection 10 of the semiconductor switch 5, to the input connection 91, also designated as collector, of the second non-transistor 85, and to the output connection 63C of the current mirror 63.

The first non-transistor 84 is connected by its input connection 92, also designated as collector, to the connection 63A of the current mirror 63. Also connected to this connection 63A is a resistance 93, which may be connected via a switch 94 to the frame terminal 20.

To switch on the semiconductor switch 5 it is provided that, on, the strength of a control signal fed in from outside, the switch 94 is actuated, so that there is a conductive connection between the frame terminal 20 and the resistance 93. Moreover, by the same control signal, the changeover switch 28 is brought from the third function position shown in FIG. 2, which involves a neutral position, into a first function position, in which an electrically conductive connection is made between the frame terminal 20 and the ohmic resistance arrangement 81. Via the resistance 93 flows a current I93, which results from the quotients of the sum of the voltage U21 via the freewheeling diode 21, and the auxiliary voltage U80 of the auxiliary voltage source 80, divided by the ohmic resistance R93 of the resistance 93.

Through the collector-emitter section of the non-transistor 84 and through the ohmic resistance arrangement 81 flows a current I81 corresponding to the quotients of the sum of the voltage U21 via the freewheeling diode 21, and the voltage U90 via the resistance 90, divided by the ohmic resistance R81 of the resistance 81.

At the connection 63A of the current mirror 63 flows a current which is the sum of I93 and I81. This current is reflected in current mirror 63. At connection 63C of current mirror 63 flows the reflected amount of this current. Consequently there is applied at the control connection 10 of the semiconductor switch 5 a current which results from the difference between the reflected current and the firmly set current I89 of the breaking current source 89, which for its part flows for as long as there is a potential difference between the control connection 10 and the input connection 7 of the semiconductor switch 5.

With the expiry of a period of time which is presentable and stored in the timer 25, the changeover switch 28 is switched into the third function position, so that the ohmic resistance arrangement 81 is disconnected from the frame terminal 20 and the potential at the control connection 10 of the semiconductor switch 5 is maintained by the current flow through the resistance 93 reflected in the current mirror 63.

For a switch-off operation, with the aid of an external control signal, the switch 94 is shifted into an opened state, so that the connection between the resistance 93 and the frame terminal 20 is broken. In addition, the changeover switch 28 is switched from the third function position into a second function position, in which an electrical connection is made between the frame terminal 20 and the second ohmic resistance arrangement 82. Because of this, a current I82 determined by the sum of the freewheeling voltage U21 and the voltage U90 through the resistance of the ohmic resistance arrangement 82 flows through the collector-emitter section of the second non-transistor 85. This current I82 is fed by the control charge between the input connection 7 and the control connection 10 of the semiconductor switch 5, and flows through the non-transistor 85, so that the control charge in the semiconductor switch 5 is reduced. This causes the ohmic resistance of the conductive section 9 to rise, and the voltage U21 across the freewheeling diode 21 reduces and becomes negative. By this means, the freewheeling diode 21 becomes increasingly current-conductive.

As soon as the voltage at the base of the non-transistor 85 reaches the value of 0 volts relative to the frame terminal 20, current no longer flows through the second ohmic resistance arrangement 82. The control charge in the semiconductor switch 5 is therefore determined solely by the breaking current source 89, the current of which is adapted in quantity to the switch-on duration of the freewheeling diode 21. In addition, the ohmic resistance of the resistance 90 is also so adapted to the quantity of the switch-off current that the voltage across the resistance 90 corresponds substantially to the flow voltage of the freewheeling diode 21.

After the expiry of a presettable time duration after arrival of the switch-off signal, the changeover switch 28 is switched by the timer 25 into the third function position, so that the electrical connection of the ohmic resistance arrangement 82 is interrupted by the frame potential 20.

The invention claimed is:

1. A control device for influencing a flow of energy in a load circuit between an electrical voltage source and an electrical load, having a semiconductor switch comprising a conductive section which is formed between an input connection and an output connection, adapted to be looped into the load circuit, and has an electrical resistance adjustable by means of an electrical potential which can be applied to a control connection associated with the semiconductor switch, and having a control circuit which is coupled to the control connection and comprises a freewheeling means connected in parallel to the load, wherein the control circuit is designed to supply a control current at the control connection which is proportional to a voltage via the freewheeling means, and
  wherein the control circuit comprises a voltage-current transformer and a coupling device connected electrically to the voltage-current transformer, wherein the coupling device is configured so as to provide an electrical current flowing through the voltage-current transformer in a proportional manner as control current at the control connection of the semiconductor switch, and
  wherein the control circuit includes a first control current path with a series connection of a first voltage-current converter and a first coupling device, and a second control current path with a series connection of a second voltage-current converter and a second coupling device together with a changeover device, which is designed in a first functional position to provide a control current via the first control current path, and in a second functional position to provide a control current via the second control current path, to the control connection of the semiconductor switch.

2. A control device according to claim 1, wherein the coupling device is in the form of a current mirror.

3. A control device according to claim 1, wherein the coupling device is in the form of a level shifter.

4. A control device according to claim 1, wherein the voltage-current transformer includes at least one active resistance.

5. A control device according to claim 4, wherein the voltage-current transformer is in the form of a series connection of several ohmic resistances, arranged in a meander form to reduce inductive effects.

6. A control device according to claim 4, wherein the active resistance is formed as an ohmic resistance.

7. A control device according to claim 1, wherein the control circuit includes a first coupling connection and a second coupling connection, each connected to the control connection of the semiconductor switch and switchable by means of a changeover device alternately in series with the voltage-current converter.

8. A control device according to claim 1, wherein the changeover device is so designed that it may be switched into a third functional position in which no control current is provided by a voltage-current converter to the control connection of the semiconductor switch.

9. A control device according to claim 8, wherein the changeover device is assigned an actuating device which, with the aid of a presettable time duration or with the aid of a detection of a minimum or maximum electrical voltage between the input connection and the output connection of the semiconductor switch, is designed to switch the changeover device into the third functional position.

10. A control device according to claim 8, wherein the third functional position is a neutral position.

11. A control device according to claim 1, wherein the freewheeling means is a freewheeling diode.

12. A method for controlling a semiconductor switch in a direct current load circuit, wherein a conductive section of a semiconductor switch with changeable resistance is looped in between an electrical voltage source and an electrical load, and freewheeling means are connected in parallel to the electrical load, wherein, with a change of voltage via the freewheeling means, a change of current flow in a voltage-current converter, which is connected in parallel to the voltage via the freewheeling means, is provided as a proportional control current change at a control connection of the semiconductor switch, and wherein a switch-on and/or switch-off operation for the semiconductor switch is effected with the aid of a control signal provided from the outside to the changeover device, and wherein a changeover of the changeover device from the first or second functional position into a third functional position is made following the expiry of a presettable duration of time after arrival of the control signal, or on detection of a presettable minimum or maximum voltage between the input connection and the output connection and/or between the input connection and the control connection of the semiconductor switch.

13. A method according to claim 12, wherein the freewheeling means is a freewheeling diode.

14. A method according to claim 12, wherein the third functional position is a neutral position.

* * * * *